United States Patent
Chong et al.

(10) Patent No.: US 10,403,643 B2
(45) Date of Patent: Sep. 3, 2019

(54) INVERTER CIRCUITRY

(71) Applicant: ARM Limited, Cambridge (GB)

(72) Inventors: Yew Keong Chong, Austin, TX (US); Sriram Thyagarajan, Austin, TX (US); Vincent Philippe Schuppe, Austin, TX (US)

(73) Assignee: ARM Limited, Cambridge (GB)

( * ) Notice: Subject to any disclaimer, the term of this patent is extended or adjusted under 35 U.S.C. 154(b) by 3 days.

(21) Appl. No.: 15/587,087

(22) Filed: May 4, 2017

(65) Prior Publication Data
US 2018/0323215 A1 Nov. 8, 2018

(51) Int. Cl.
*H01L 27/118* (2006.01)
*H01L 27/02* (2006.01)
*G06F 17/50* (2006.01)

(52) U.S. Cl.
CPC .... *H01L 27/11807* (2013.01); *G06F 17/5068* (2013.01); *H01L 27/0207* (2013.01); *H01L 2027/11866* (2013.01); *H01L 2027/11881* (2013.01)

(58) Field of Classification Search
CPC .............. H01L 21/11807; H01L 27/0207
USPC .......................................................... 257/206
See application file for complete search history.

(56) References Cited

U.S. PATENT DOCUMENTS

| | | | |
|---|---|---|---|
| 2016/0064054 A1* | 3/2016 | Chen | G11C 7/222 365/189.02 |
| 2018/0219514 A1* | 8/2018 | Schober | H03K 19/018564 |
| 2018/0219519 A1* | 8/2018 | Schober | H03F 3/45183 |
| 2018/0224878 A1* | 8/2018 | Schober | G05F 3/245 |
| 2018/0226930 A1* | 8/2018 | Schober | H03F 3/45183 |

* cited by examiner

*Primary Examiner* — Jami Valentine Miller
(74) *Attorney, Agent, or Firm* — Pramudji Law Group PLLC; Ari Pramudji

(57) ABSTRACT

Various implementations described herein are directed to an integrated circuit having multiple access wires including a first access wire coupled to a first access port of the integrated circuit and a second access wire coupled to a second access port of the integrated circuit. The integrated circuit may include inverter circuitry having a first plurality of inverters coupled to the first access wire and a second plurality of inverters coupled to the second access wire. The first plurality of inverters may be positioned adjacent to the second plurality of inverters in an alternating manner.

15 Claims, 7 Drawing Sheets

US 10,403,643 B2

INVERTER CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, in physical design, performance and reliability at advanced process nodes may be limited by circuit resistance as components are scaled down. For instance, in advance physical design, the use of conventional inverters typically results in significant IR-drop with shared power supplies that fail to account for high ohmic resistance between directly coupled circuit components. This failure may significantly impact the performance and IR-drop of the circuit components.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to innovative placement of inverter circuitry to improve performance and current/resistance (IR) drop when utilizing multi-fingered inverters. Generally, gates wires of multi-fingered inverters may be referred to as fingers, wherein multi-fingered inverters may have multiple gate wires, as shown and described herein. Further, various implementations described herein are directed to an innovative design that improves memory and system-on-a chip (SOC) performance and IR drop without increasing area. For instance, IR drop refers to the IR drop to source of p-type metal-oxide-semiconductor (PMOS) transistor in complementary MOS (CMOS) devices. IR drop may refer to various resistances of transistor components in reference to various coupling to metal layers, vias, etc. As described herein, inverter circuitry may utilize various types of multi-fingered inverters, such as, e.g., 2-fingered (X2), 4-fingered (X4), 6-fingered (X6), etc., to thereby improve performance of an integrated circuit without increasing area of the physical layout design. Thus, inverter circuitry as described herein may boost performance without increasing area of the physical layout design.

As provided herein, various implementations of integrated inverter circuitry and methods for utilizing multi-fingered inverters will now be described in greater detail herein with reference to FIGS. 1A-4.

Figure 1A:
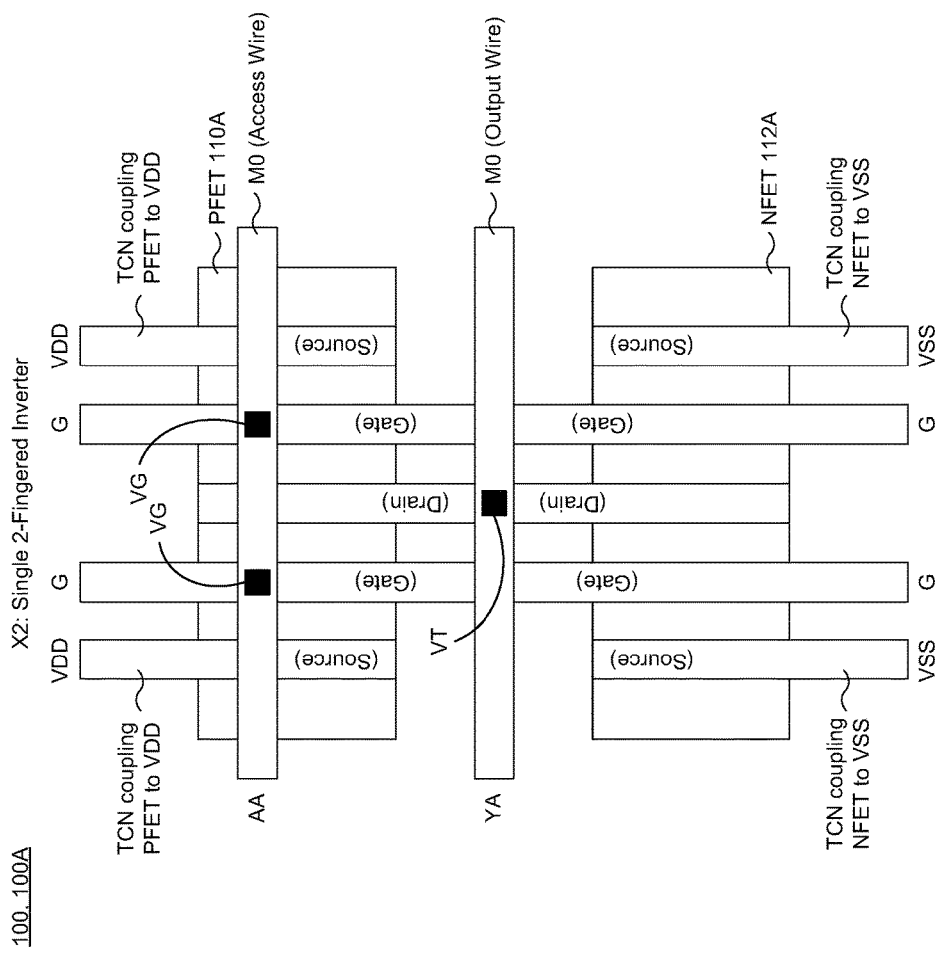
FIGS. 1A-1C illustrate various layout diagrams of inverter circuitry embodied with multi-finger inverters in accordance with implementations described herein.
Figure 1B:
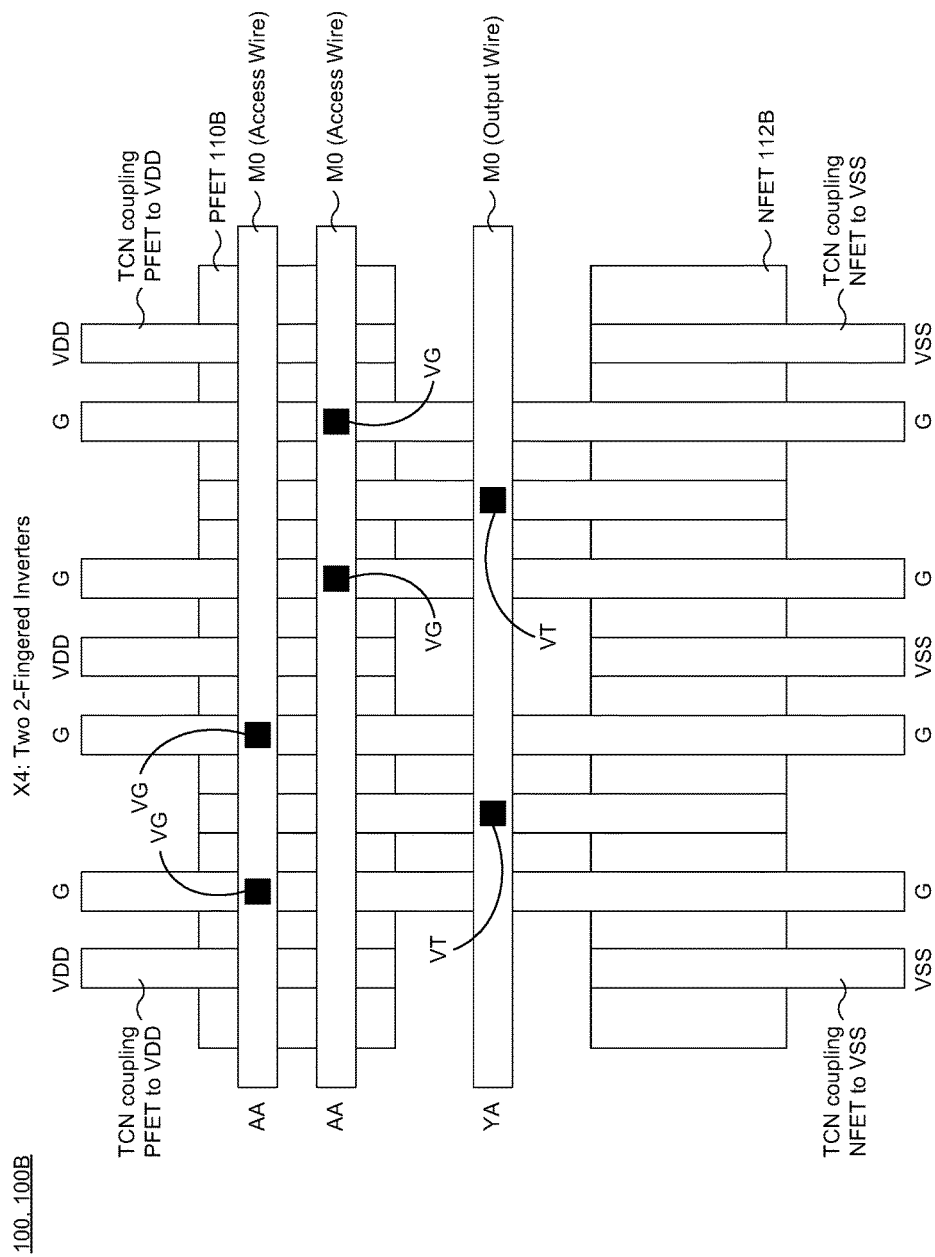
Figure 1C:
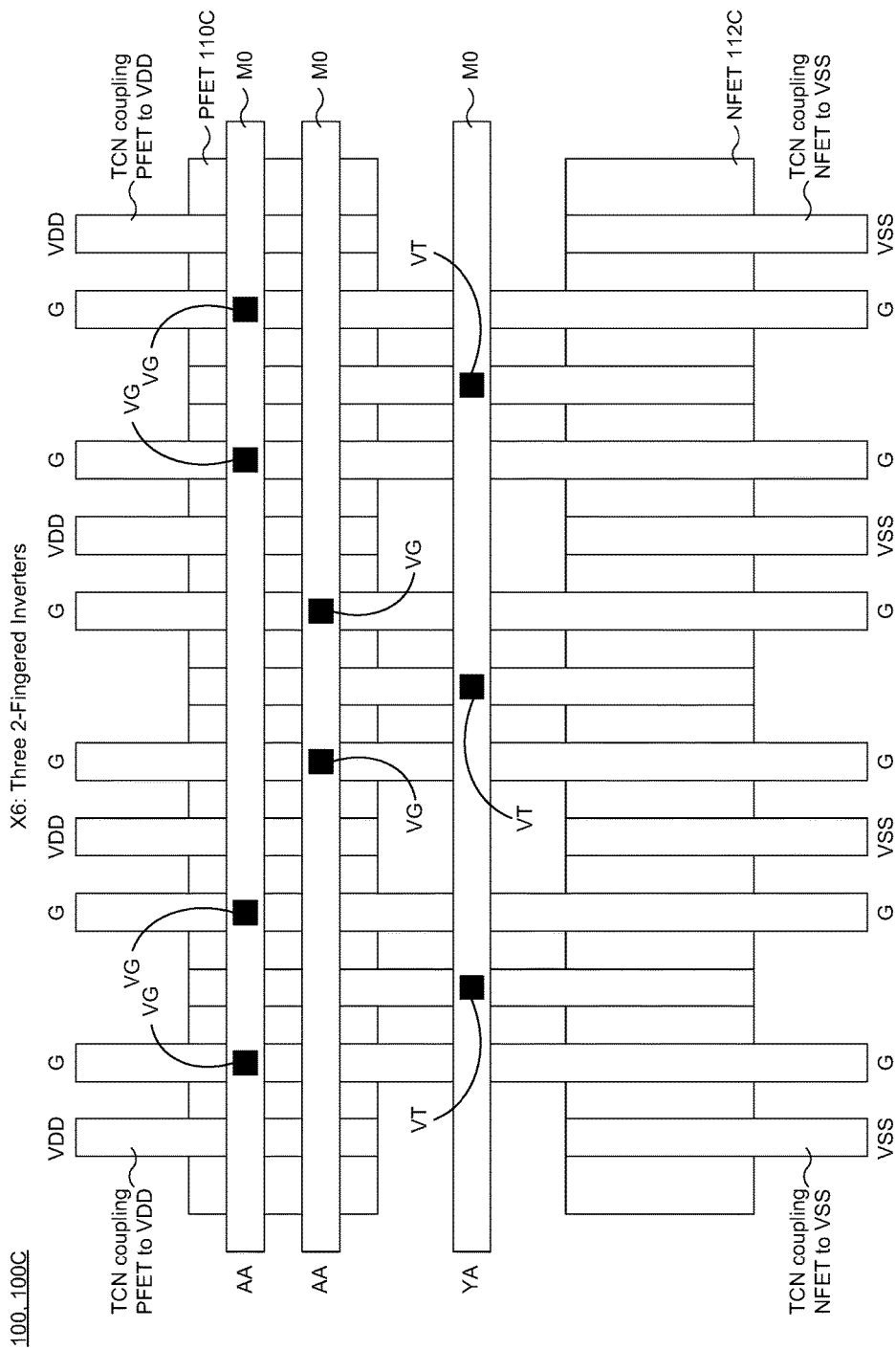

In reference to physical layout design, FIGS. 1A-1C illustrate various layout diagrams of inverter circuitry 100 embodied as various multi-finger inverters in accordance with implementations described herein. In particular, FIG. 1A illustrates a first physical layout design of a single 2-fingered inverter 100A (i.e., 2-fingered X2 inverter), FIG. 1B illustrates a second physical layout design of a double 2-fingered inverter 100B (i.e., 4-fingered X4 inverter), and FIG. 1C illustrates a third physical layout design of a triple 2-fingered inverter 100C (i.e., 6-fingered X6 inverter).

In reference to FIG. 1A, the physical design layout of the 2-fingered inverter 100A may be embodied as a standard cell layout of an integrated circuit as shown in an instance of the 2-fingered inverter 100A. As shown, the 2-fingered inverter 100A may include multiple transistors 110A, 112A including multiple first transistors 110A (e.g., 2) of a first type (e.g., p-type) and multiple second transistors 112A (e.g., 2) of a second type (e.g., n-type) that is different from the first type. The 2-fingered inverter 100A may include a first wiring layer TCN that provides source (S), gate (G) and drain (D) wires for the multiple transistors 110A, 112A. The source wires of TCN may be used to couple the first transistors 110A to a first voltage supply VDD (e.g., a positive voltage or power supply; >0V) and to further couple the second transistors 112A to a second voltage supply VSS (e.g., a ground voltage or power supply; GND; 0V) that is different than the first voltage supply VDD. The gate wires of TCN and the drain wires of TCN may be used to couple the first transistors 110A to the second transistors 112A. Generally, the gates wires (G) may be referred to as fingers.

Further, the 2-fingered inverter 100A may include a second wiring layer M0 that provides an access wire (AA) and an output wire (YA). The access wire (AA) may be coupled to the gate wires of TCN with one or more vias VG, and the output wire (YA) may be coupled to the drain wires of TCN with one or more vias VT. The second wiring layer M0 may be used to provide a first conductive path or branch to access the transistors 110A, 112A with the access wire (AA) and vias VG and may further provide a second conductive path or branch for output from the transistors 110A, 112A with the output wire (YA) and vias VT. The output wire (YA) may be used to couple the 2-fingered inverter 100A to one or more other circuits in a cell network of the integrated circuit.

In some implementations, the first transistors 110A may be p-type metal-oxide-semiconductor (PMOS) transistors, such as, e.g., p-type field effect transistors (PFETs), and the second transistors 112A may be an n-type MOS (NMOS) transistors, such as, e.g., n-type FETs (NFETs). As shown, the first wiring layer TCN may be used to electrically couple the first transistors 110A (PFETs) to the second transistors 112A (NFETs). The first wiring layer TCN may be used to electrically couple the first transistors 110A (PFETs) to a first power rail (VDD) having a first polarity (e.g., positive; +) and further electrically couple the second transistors 112A (NFETs) to a second power rail having a second polarity (e.g., ground; 0V) that is different than the first polarity. Further, the first power rail may provide a first voltage at the first polarity, such as, e.g., the source voltage supply (VDD), and the second power rail may provide a second voltage at the second polarity, such as, e.g., a ground voltage supply (VSS or GND).

In some implementations, the first and second wiring layers TCN, MO (e.g., metal interconnects) may be formed on different levels of interconnect and coupled together vertically with vias VG, VT (e.g., metal vias). In a generalized concept, each layer in a network may have multiple parallel geometries. For adjacent layers, this may result in multiple intersection points for vias (or cuts in the general case). In some cases, this may assist with performance and electromigration. Further, these layers may exhibit a resistive issue, resulting in the possibility of a small amount of capacitance relative to total capacitance, which may or may not affect performance.

In reference to FIG. 1B, the physical design layout of the 4-fingered inverter 100B may be embodied as a standard cell layout of an integrated circuit as shown in an instance of the 4-fingered inverter 100B, where similar features provide similar scope and operation as described in reference to FIG. 1A. As shown, the 4-fingered inverter 100B may include multiple transistors 110B, 112B including multiple first transistors 110B (e.g., 4) of a first type (e.g., p-type) and multiple second transistors 112B (e.g., 4) of a second type (e.g., n-type) that is different from the first type. In some instances, the 4-fingered inverter (X4) may be split into two 2-fingered inverters (2: X2).

Further, the 4-fingered inverter 100B may include a second wiring layer MO that provides multiple access wires (AA) and the output wire (YA). The access wires (AA) may be coupled to the gate wires (G) of TCN with the one or more vias VG, and the output wire (YA) may be coupled to the drain wires of TCN with one or more vias VT. As shown, one of the access wires (AA) may be coupled to one of the split 2-fingered inverters (X2), such as, e.g., a left-side half of the 4-fingered inverter (X4), and another one of the access wires (AA) may be coupled to another one of the split 2-fingered inverters (X2), such as, e.g., a right-side half of the 4-fingered inverter (X4). The second wiring layer MO may provide a first conductive path or branch to access the transistors 110B, 112B with the access wires (AA) and vias VG and may further provide a second conductive path or branch for output from the transistors 110B, 112B with the output wire (YA) and vias VT. The output wire (YA) may be used to couple the 4-fingered inverter 100B to one or more other circuits in a cell network of the integrated circuit.

In reference to FIG. 1C, the physical design layout of the 6-fingered inverter 100C may be embodied as a standard cell layout of an integrated circuit as shown in an instance of the 6-fingered inverter 100C, where similar features provide similar scope and operation as described in reference to FIGS. 1A-1B. As shown, the 6-fingered inverter 100C may include multiple transistors 110C, 112C including multiple first transistors 110C (e.g., 6) of a first type (e.g., p-type) and multiple second transistors 112C (e.g., 6) of a second type (e.g., n-type) that is different from the first type. In some instances, the 6-fingered inverter (X6) may be split into three 2-fingered inverters (3: X2).

Further, the 6-fingered inverter 100C may include a second wiring layer MO that provides the multiple access wires (AA) and the output wire (YA). The multiple access wires (AA) may be coupled to the gate wires (G) of TCN with one or more vias VG, and the output wire (YA) may be coupled to the drain wires of TCN with one or more vias VT. As shown, one of the access wires (AA) may be coupled to two of the split 2-fingered inverters (X2), such as, e.g., a left-side third and a right-side third of the 6-fingered inverter (X6), and another one of the access wires (AA) may be coupled to another one of the split 2-fingered inverters (X2), such as, e.g., a middle third (or a central third) of the 6-fingered inverter (X6). The second wiring layer MO may provide a first conductive path or branch to access the transistors 110C, 112C with the access wires (AA) and vias VG and may further provide a second conductive path or branch for output from the transistors 110C, 112C with the output wire (YA) and vias VT. The output wire (YA) may be used to couple the 6-fingered inverter 100C to one or more other circuits in a cell network of the integrated circuit.

Figure 2A:
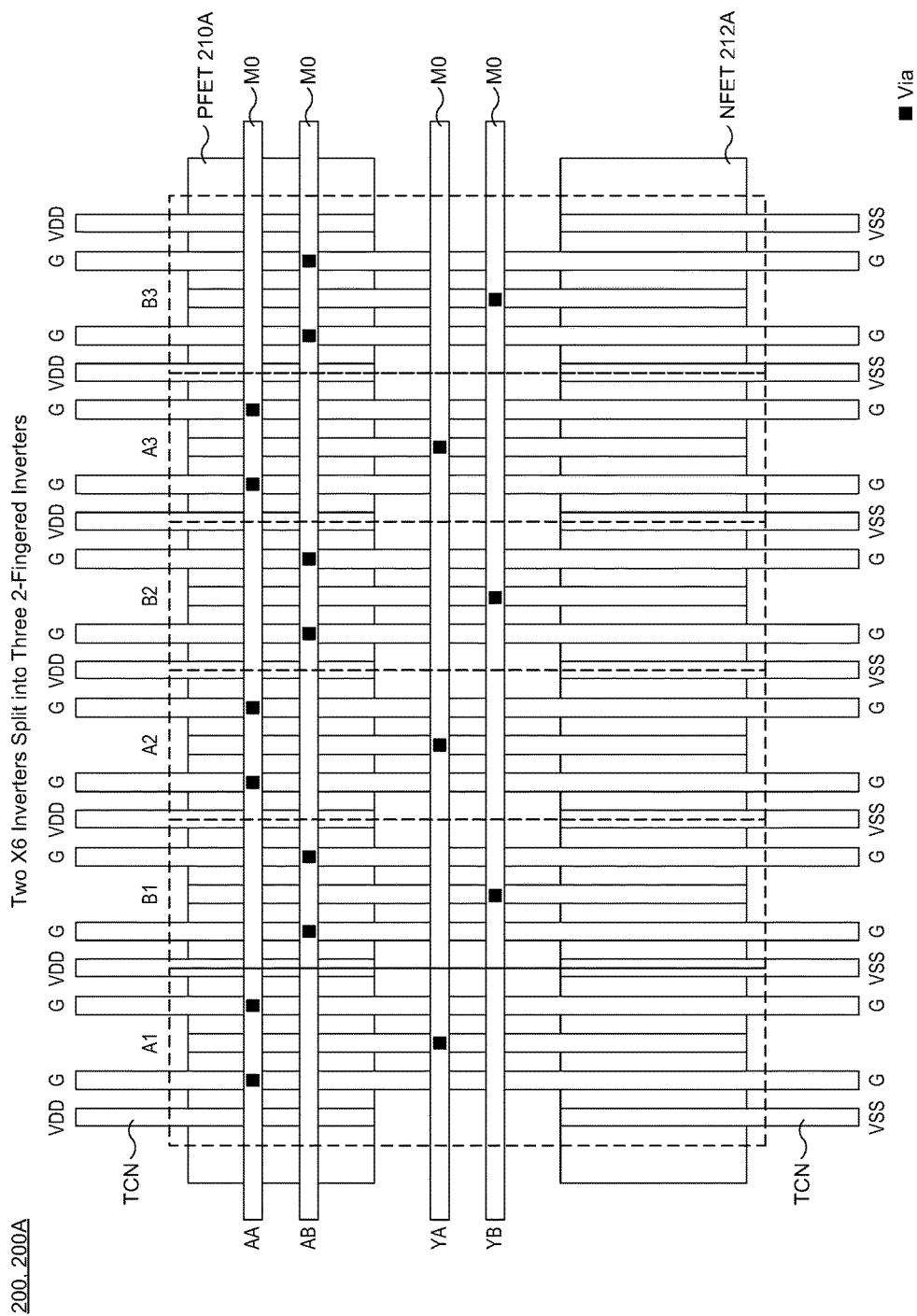
FIGS. 2A-2B illustrate layout diagrams of inverter circuitry utilizing multi-finger inverters in accordance with various implementations described herein.
Figure 2B:
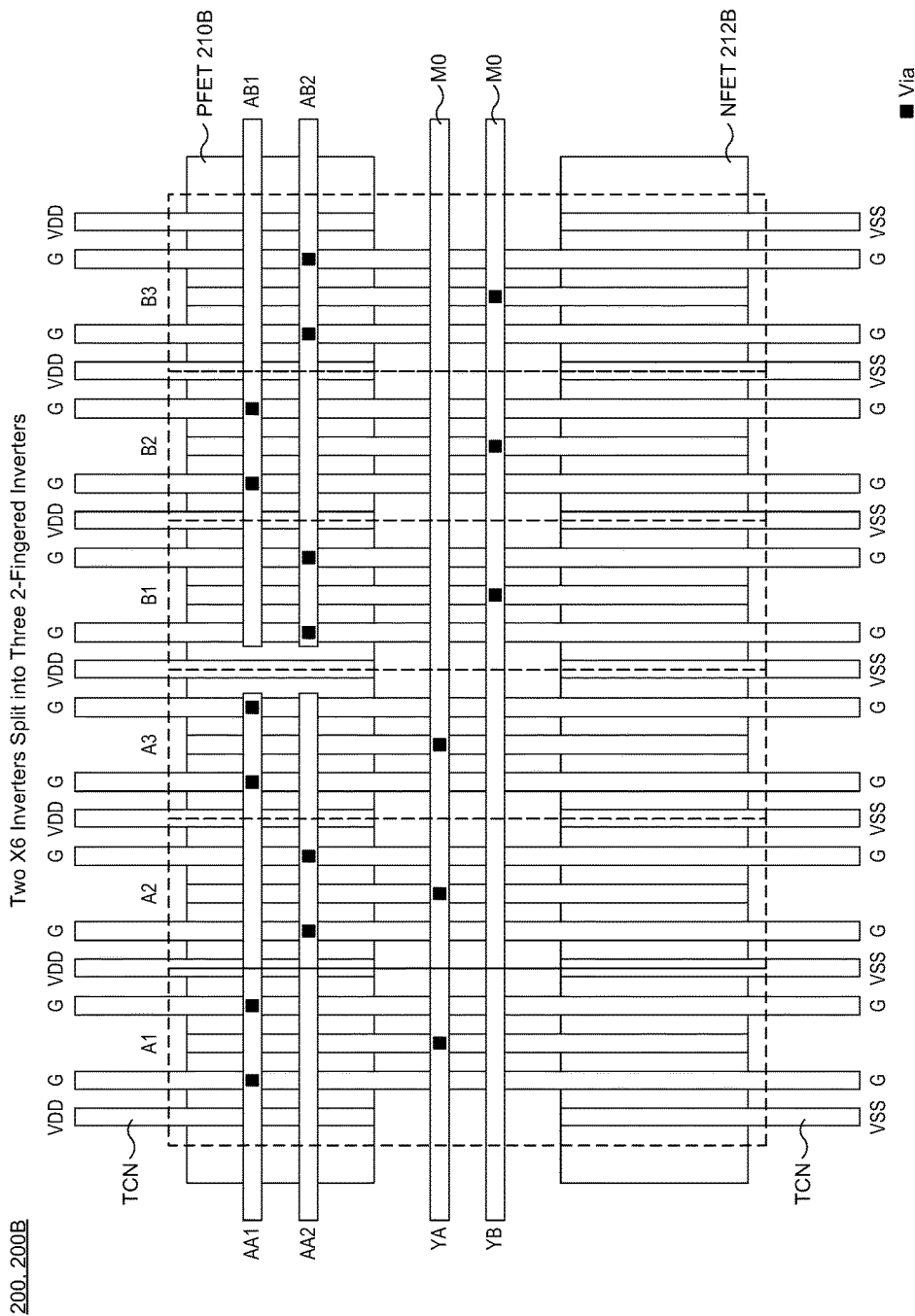

In reference to physical layout design, FIGS. 2A-2B illustrate layout diagrams of inverter circuitry 200 using a plurality of multi-finger inverters in accordance with various implementations described herein. As shown in FIGS. 2A-2B, the standard cell layout of an integrated circuit is shown with various instances of multiple 6-fingered inverters 200 that may be split into multiple sets of multiple 2-fingered inverters, where similar features provide similar scope and operation as described in reference to FIGS. 1A-1C. In particular, FIG. 2A shows a first arrangement of two 6-fingered inverters (2: X6) 200A that may be split into two sets of three 2-fingered inverters (2 sets of 3: X2), and FIG. 2B shows a second arrangement of two 6-fingered inverters (2: X6) 200B that may be split into two sets of three 2-fingered inverters (2 sets of 3: X2).

As shown in FIG. 2A, the first arrangement of two 6-fingered inverters (2: X6) 200A may include multiple access wires AA, AB including a first access wire AA coupled to a first access port (Port A) of the integrated circuit and a second access wire AB coupled to a second access port (Port B) of the integrated circuit. The inverter circuitry 200, 200A may include a first plurality of inverters A1, A2, A3 coupled to the first access wire AA with vias (Via, e.g., VG, VT) and a second plurality of inverters B1, B2, B3 coupled to the second access wire AB with vias (Via, e.g., VG, VT). As shown, the first plurality of inverters A1, A2, A3 may be positioned adjacent to the second plurality of inverters B1, B2, B3 in an alternating manner, such as, e.g., A1, B1, A2, B2, A3, B3.

The inverter circuitry 200, 200A may include a shared power supply VDD for the first plurality of inverters A1, A2, A3 coupled to the first access wire AA and for the second plurality of inverters B1, B2, B3 coupled to the second access wire AB. In some cases, the shared power supply may be a one volt (1V) shared power supply, and the inverter circuitry 200, 200A of the integrated circuit may be further configured for memory applications that support the one volt (1V) shared power supply. The inverter circuitry 200, 200A may also include multiple output wires YA, YB including a first output wire YA coupling a first output port (Port YA) of the integrated circuit to the first plurality of inverters A1, A2, A3 and a second output wire YB coupling a second output port (Port YB) of the integrated circuit to the second plurality of inverters B1, B2, B3.

In some implementations, each of the first and second plurality of inverters A1, B1, A2, B2, A3, B3 (in any order thereof) may include a plurality of two-fingered inverters (X2) in various arrangements and/or configurations. As shown, each of the two-fingered inverters may include one or more transistors, such as, e.g., complementary metal-oxide-semiconductor (CMOS) transistors. In various arrangements and/or configurations, each of the CMOS transistors may include p-type MOS (PMOS) transistors and n-type MOS (NMOS) transistors, and in some instances, each of the CMOS transistors may include p-type field effect transistors (PFETs) and n-type field effect transistors (NFETs).

As shown in FIG. 2A, each of the first and second plurality of inverters may include a six-fingered inverter (X6) that is split into three separate two-fingered inverters (3: X2). For instance, the first six-fingered inverter (X6) may include a first set of 2-fingered inverters X2: A1, A2, A3, and the second six-fingered inverter (X6) may include a second set of 2-fingered inverters X2: B1, B2, B3 that may be positioned adjacent to each in an alternating manner, such as, e.g., A1, B1, A2, B2, A3, B3.

FIG. 2A provides a physical design technique of splitting each X6 inverter into three X2 inverters and staggering each of X2 inverters. With this technique, the shared voltage or power supply may not be affected if inverters A (X2: A1, A2, A3) and inverters B (X2: B1, B2, B3) are not toggling at the same time, i.e., wherein only a single transistor is activated at a time. This technique may be utilized in physical decoder designs and various other physical 1-hot logic designs. Further, this technique improves performance without increasing area or altering routing overhead.

Alternately, with reference to FIGS. 1B and 2A, each of the first and second plurality of inverters may include a four-fingered inverter (X4) that is split into 2 separate two-fingered inverters (2: X2). For instance, a first four-fingered inverter (X4) may include a first set of 2-fingered inverters X2: A1, A2, and a second four-fingered inverter (X4) may include a second set of 2-fingered inverters X2: B1, B2 that may be positioned adjacent to each in an alternating manner, such as, e.g., A1, B1, A2, B2.

In another implementations, as shown in reference to FIG. 2B, the first access wire AA may comprise a plurality of first access wires AA1, AA2 that may be coupled to the first access port (Port A) of the integrated circuit, and the first plurality of inverters A1, A2, A3 may be coupled to the plurality of first access wires AA1, AA2 in an alternating manner. Further, as shown in FIG. 2B, the second access wire AB may comprise a plurality of second access wires AB1, AB2 that may be coupled to the second access port (Port B) of the integrated circuit, and the second plurality of inverters B1, B2, B3 may be coupled to the plurality of second access wires AB1, AB2 in an alternating manner.

FIG. 2B provides a physical design technique of splitting each X6 inverter into three X2 inverters and stacking each of X2 inverters. With this other technique, the shared voltage or power supply may not be affected if inverters A (X2: A1, A2, A3) and inverters B (X2: B1, B2, B3) are not toggling at the same time, i.e., wherein only a single transistor is activated at a time. This technique may be utilized in physical decoder designs and various other physical 1-hot logic designs. Further, this technique improves performance without increasing area or altering routing overhead.

Figure 3:
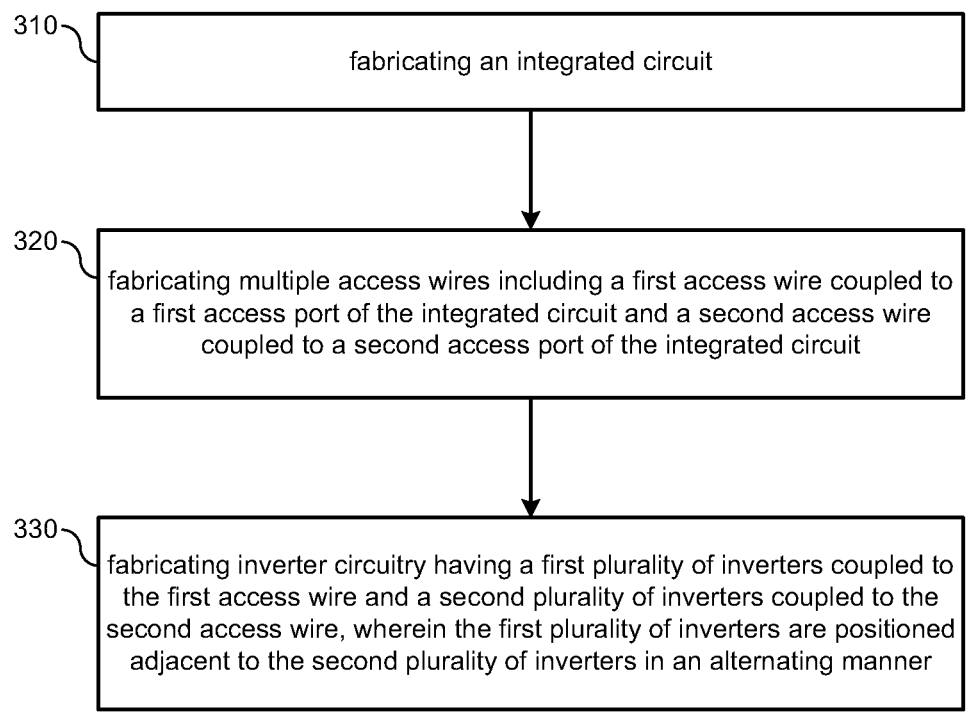
FIG. 3 illustrates a process flow diagram of a method for manufacturing an integrated circuit in accordance with various implementations described herein.

FIG. 3 illustrates a process flow diagram of a method 300 for manufacturing an integrated circuit in accordance with various implementations described herein.

It should be understood that even though method 300 indicates a particular order of execution of operations, in some instances, certain portions of the operations may be executed in a different order, and on different systems. In some other instances, additional operations or steps may be added to and/or omitted from method 300. Further, computing device 300 of FIG. 3 may be configured to perform method 300. In some implementations, method 300 may be implemented as a program or software instruction process configured to enhance performance in physical design.

At block 310, method 300 may include fabricating an integrated circuit. At block 320, method 300 may include fabricating multiple access wires including a first access wire coupled to a first access port of the integrated circuit and a second access wire coupled to a second access port of the integrated circuit. At block 330, method 300 may include fabricating inverter circuitry having a first plurality of inverters coupled to the first access wire and a second plurality of inverters coupled to the second access wire, wherein the first plurality of inverters are positioned adjacent to the second plurality of inverters in an alternating manner.

The inverter circuitry may include a shared power supply, such as, e.g., a one volt (1V) shared power supply, for the first plurality of inverters coupled to the first access wire and for the second plurality of inverters coupled to the second access wire. Each of the first and second plurality of inverters may include a plurality of two-fingered inverters. The method 300 may further include fabricating multiple output wires including a first output wire coupling a first output port of the integrated circuit to the first plurality of inverters and a second output wire coupling a second output port of the integrated circuit to the second plurality of inverters.

In some instances, fabricating the multiple access wires may include fabricating the first access wire as a plurality of first access wires that are coupled to the first access port, and the first plurality of two-fingered inverters are coupled to the plurality of first access wires in an alternating manner. Further, fabricating the multiple access wires may also include fabricating the second access wire as a plurality of second access wires that are coupled to the second access port, and the second plurality of two-fingered inverters are coupled to the plurality of second access wires in an alternating manner.

Figure 4:
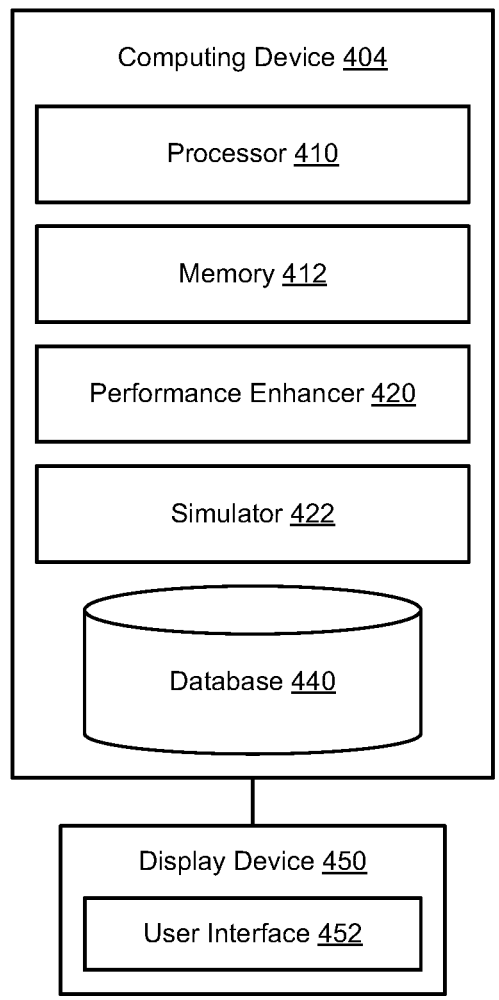
FIG. 4 illustrates a diagram of a system for implementing physical design in accordance with various implementations described herein.

FIG. 4 illustrates a diagram of a system 400 for simulating physical design in accordance with various implementations described herein. The system 400 may also be configured for assisting with fabrication of an integrated circuit having a physical layout design with improved yield, output net resistance, and electromigration in accordance with various implementations described herein.

In reference to FIG. 4, the system 400 may include a computer based system configured to implement inverter circuitry in physical layout design. The system 400 may be associated with at least one computing device 404 that is implemented as a special purpose machine configured to implement inverter circuitry in physical layout design, as described herein. In various implementations, the computing device 404 may include any number of standard element(s) and/or component(s), including at least one processor(s) 410, memory 412 (e.g., non-transitory computer-readable storage medium), one or more database(s) 440, power, peripherals, and other computing elements and/or components that may not be specifically shown in FIG. 4.

The computing device 404 may include instructions stored on the non-transitory computer-readable medium 412 that are executable by the at least one processor 410. The computing device 404 may be associated with a display device 450 (e.g., a monitor or other display) that may be used to provide a user interface (UI) 452, such as, e.g., a graphical user interface (GUI). In some instances, the UI 452 may be used to receive various parameters and/or preferences from a user for managing, operating, and/or utilizing the computing device 404. As such, the computing device 404 may include the display device 450 for providing output to a user, and the display device 450 may include the UI 452 for receiving input from the user.

In various implementations, the computing device 404 may be configured to implement various methodologies and/or techniques for implementing inverter circuitry in physical layout design. For instance, the computing device 404 may be configured to analyze operating conditions for physical layout cells of an integrated circuit. Further, in reference to FIG. 4, the computing device 404 may include a performance enhancer module 420 (or layout optimizer) configured to cause the at least one processor 410 to implement one or more techniques described in reference to FIGS. 1A-3, including techniques related to implementing inverter circuitry in physical layout design for improved yield, output net resistance, and electromigration. The performance enhancer module 420 may be implemented in hardware and/or software. If implemented in software, the performance enhancer module 420 may be stored in memory 412 and/or database 440. If implemented in hardware, the performance enhancer module 420 may be a separate processing component configured to interface with the processor 410. Further, in some scenarios, the performance enhancer module 420 may be configured to cause the at least one processor 410 to assist with fabricating an integrated circuit having various inverter circuitry as described in reference to FIGS. 1A-3.

Moreover, in reference to FIG. 4, the computing device 404 may include a simulator module 422 configured to cause the at least one processor 410 to generate one or more simulations of the integrated circuit. The simulator module 422 may be referred to as a simulating component that may be implemented in hardware and/or software. If implemented in software, the simulator module 422 may be stored in memory 412 or database 440. If implemented in hardware, the simulator module 420 may be a separate processing component configured to interface with the processor 410. In some instances, the simulator module 422 may include a SPICE simulator configured to generate SPICE simulations of the integrated circuit. Generally, SPICE refers to an acronym for Simulation Program with Integrated Circuit Emphasis, which is an open source analog electronic circuit simulator. Further, SPICE is a general-purpose software program used by the semiconductor industry to check the integrity of integrated circuit designs and to predict the behavior of integrated circuit designs. Therefore, in some instances, the performance enhancer module 420 may be configured to interface with the simulator module 422 to generate timing data based on one or more simulations (e.g., SPICE simulations) of an integrated circuit that may be used for analyzing the timing data of the integrated circuit to identify instances of timing performance and/or degradation. Further, the performance enhancer module 420 may be configured to use the one or more simulations (including, e.g., SPICE simulations) of an integrated circuit for assisting with implementing inverter circuitry in physical layout design and with a standard cell layout for improved yield, output net resistance, and electromigration, as described herein.

The computing device 404 may include one or more databases 440 configured to store and/or record data and information related to implementing inverter circuitry in physical layout design. The database(s) 440 may be configured to store and/or record data and information related to the integrated circuit, operating conditions, and/or timing data and performance. The database(s) 440 may be configured to store and/or record data and information related to the integrated circuit performance and timing data in reference to simulation data (including, e.g., SPICE simulation data).

Described herein are implementations of an integrated circuit. The integrated circuit may include multiple access wires including a first access wire coupled to a first access port of the integrated circuit and a second access wire coupled to a second access port of the integrated circuit. The integrated circuit may include inverter circuitry having a first plurality of inverters coupled to the first access wire and a second plurality of inverters coupled to the second access wire. The first plurality of inverters are positioned adjacent to the second plurality of inverters in an alternating manner.

Described herein are implementations of an integrated circuit. The integrated circuit may include multiple access ports including a first access port and a second access port. The integrated circuit may include multiple access wires including a first access wire coupled to the first access port and a second access wire coupled to the second access port. The integrated circuit may include inverter circuitry having a first plurality of two-fingered inverters coupled to the first access wire and a second plurality of two-fingered inverters coupled to the second access wire. The first plurality of two-fingered inverters are positioned adjacent to the second plurality of two-fingered inverters in an alternating manner. The integrated circuit may include multiple output ports including a first output port and a second output port. The integrated circuit may include multiple output wires including a first output wire coupling the first output port to the first plurality of two-fingered inverters and a second output wire coupling the second output port to the second plurality of two-fingered inverters.

Described herein are various implementations of a method for manufacturing an integrated circuit. The method may include fabricating multiple access wires including a first access wire coupled to a first access port of the integrated circuit and a second access wire coupled to a second access port of the integrated circuit. The method may include fabricating inverter circuitry having a first plurality of inverters coupled to the first access wire and a second plurality of inverters coupled to the second access wire. The first plurality of inverters are positioned adjacent to the second plurality of inverters in an alternating manner.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
    multiple access wires including a first access wire coupled to a first access port of the integrated circuit and a second access wire coupled to a second access port of the integrated circuit; and
    inverter circuitry having a first plurality of inverters coupled to the first access wire and a second plurality of inverters coupled to the second access wire,
    wherein the first plurality of inverters are positioned adjacent to the second plurality of inverters in an alternating manner.

2. The integrated circuit of claim 1, wherein the inverter circuitry comprises a shared power supply for the first plurality of inverters coupled to the first access wire and for the second plurality of inverters coupled to the second access wire.

3. The integrated circuit of claim 2, wherein the shared power supply comprises a one volt (1V) shared power supply, and wherein the integrated circuit is configured for memory applications that support the one volt (1V) shared power supply.

4. The integrated circuit of claim 1, further comprising:
    multiple output wires including a first output wire coupling a first output port of the integrated circuit to the first plurality of inverters and a second output wire coupling a second output port of the integrated circuit to the second plurality of inverters.

5. The integrated circuit of claim 1, wherein each of the first and second plurality of inverters comprises a plurality of two-fingered inverters.

6. The integrated circuit of claim 5, wherein each of the two-fingered inverters includes complementary metal-oxide-semiconductor (CMOS) transistors.

7. The integrated circuit of claim 6, wherein each of the CMOS transistors includes p-type MOS (PMOS) transistors and n-type MOS (NMOS) transistors.

8. The integrated circuit of claim 6, wherein each of the CMOS transistors includes p-type field effect transistors (PFET) and n-type field effect transistors (NFET).

9. The integrated circuit of claim 1, wherein each of the first and second plurality of inverters comprises a four-fingered inverter that is split into two separate two-fingered inverters.

10. The integrated circuit of claim 1, wherein each of the first and second plurality of inverters comprises a six-fingered inverter that is split into three separate two-fingered inverters.

11. The integrated circuit of claim 1, wherein:
the first access wire comprises a plurality of first access wires that are coupled to the first access port of the integrated circuit, and the first plurality of inverters are coupled to the plurality of first access wires in an alternating manner, and
the second access wire comprises a plurality of second access wires that are coupled to the second access port of the integrated circuit, and the second plurality of inverters are coupled to the plurality of second access wires in an alternating manner.

12. A method for manufacturing an integrated circuit, the method comprising:
fabricating multiple access wires including a first access wire coupled to a first access port of the integrated circuit and a second access wire coupled to a second access port of the integrated circuit; and
fabricating inverter circuitry having a first plurality of inverters coupled to the first access wire and a second plurality of inverters coupled to the second access wire, wherein the first plurality of inverters are positioned adjacent to the second plurality of inverters in an alternating manner.

13. The method of claim 12, wherein:
the inverter circuitry further comprises a one volt (1V) shared power supply for the first plurality of inverters coupled to the first access wire and for the second plurality of inverters coupled to the second access wire, and
each of the first and second plurality of inverters comprises a plurality of two-fingered inverters.

14. The method of claim 12, further comprising:
fabricating multiple output wires including a first output wire coupling a first output port of the integrated circuit to the first plurality of inverters and a second output wire coupling a second output port of the integrated circuit to the second plurality of inverters.

15. The method of claim 12, wherein fabricating multiple access wires comprises:
fabricating the first access wire such that a plurality of first access wires are coupled to the first access port, that the first plurality of two-fingered inverters are coupled to the plurality of first access wires in an alternating manner, and
fabricating the second access wire such that a plurality of second access wires are coupled to the second access port, and that the second plurality of two-fingered inverters are coupled to the plurality of second access wires in an alternating manner.

* * * * *